(12) United States Patent
Lee et al.

(10) Patent No.: US 8,702,294 B2
(45) Date of Patent: Apr. 22, 2014

(54) LIGHT SOURCE UNIT AND BACKLIGHT ASSEMBLY HAVING THE SAME

(75) Inventors: Young-Keun Lee, Cheonan-si (KR);
Si-Joon Song, Suwon-si (KR);
Eui-Jeong Kang, Asan-si (KR);
Hyun-Cheol Moon, Anyang-si (KR);
Seung-Hwan Baek, Seoul (KR)

(73) Assignee: Samsung Display Co., Ltd. (KR)

( * ) Notice: Subject to any disclaimer, the term of this patent is extended or adjusted under 35 U.S.C. 154(b) by 509 days.

(21) Appl. No.: 13/071,273

(22) Filed: Mar. 24, 2011

(65) Prior Publication Data

US 2011/0249469 A1    Oct. 13, 2011

(30) Foreign Application Priority Data

Apr. 12, 2010    (KR) .......................... 10-2010-0033363

(51) Int. Cl.
*F21S 4/00*    (2006.01)

(52) U.S. Cl.
USPC ...... 362/612; 362/613; 362/249.02; 362/646; 362/657

(58) Field of Classification Search
USPC ............... 362/249.02, 249.03, 640, 646, 647, 362/657, 658
See application file for complete search history.

(56) References Cited

U.S. PATENT DOCUMENTS 7,845,828 B2 *  12/2010  Ku ........................... 362/249.02
8,026,671 B2 *  9/2011   Ku ............................ 315/185 R
8,262,250 B2 *  9/2012   Li et al. ........................ 362/219

* cited by examiner

*Primary Examiner* — Anabel Ton
(74) *Attorney, Agent, or Firm* — Innovation Counsel LLP

(57) ABSTRACT

Provided are a light source unit including a plurality of light-emitting diode (LED) packages, which are directly electrically connected to each other, and a backlight assembly having the light source unit. The light source unit includes a first LED package and a second LED package which are adjacent to each other, wherein each of the first LED package and the second LED package includes an LED chip, a lead frame which supplies current to the LED chip, and a housing which fixes the LED chip and the lead frame in place, wherein an end of the lead frame of the first LED package directly contacts an end of the lead frame of the second LED package.

24 Claims, 18 Drawing Sheets

US 8,702,294 B2

LIGHT SOURCE UNIT AND BACKLIGHT ASSEMBLY HAVING THE SAME

This application claims priority from Korean Patent Application No. 10-2010-0033363 filed on Apr. 12, 2010 in the Korean Intellectual Property Office, the disclosure of which is incorporated herein by reference in its entirety.

BACKGROUND OF THE INVENTION

1. Field of the Invention

The present invention relates to a light source unit and a backlight assembly having the same, and more particularly, to a light source unit including a plurality of light-emitting diode (LED) packages, which are directly electrically connected to each other, and a backlight assembly having the light source unit.

2. Description of the Related Art

Liquid crystal displays (LCDs) are one of the most widely used types of flat panel displays (FPDs). Generally, an LCD includes two substrates having electrodes and a liquid crystal layer interposed between the substrates. In an LCD, voltages are applied to the electrodes, and the applied voltages cause liquid crystal molecules in the liquid crystal layer to rearrange, thereby controlling the amount of light that passes through the liquid crystal layer.

Because LCDs cannot emit light by themselves, they require a backlight assembly to provide the light that passes through the liquid crystal layer. Examples of light sources used in backlight assemblies include cold cathode fluorescent lamps (CCFLs), external electrode fluorescent lamps (EEFLs), and light-emitting diodes (LEDs). In particular, the demand for backlight assemblies using LEDs with high luminance is increasing.

LEDs may be used in the form of LED packages. LED packages are arranged on a printed circuit board (PCB) and are used accordingly as a light source of an LCD.

SUMMARY OF THE INVENTION

A light source unit is provided that includes light-emitting diode (LED) packages which are directly electrically connected to each other.

A backlight assembly having the LED packages is also provided.

According to one aspect, there is provided a light source unit including a first LED package and a second LED package which are adjacent to each other, wherein each of the first LED package and the second LED package includes an LED chip, a lead frame which supplies current to the LED chip, and a housing which fixes the LED chip and the lead frame in place, wherein an end of the lead frame of the first LED package directly contacts an end of the lead frame of the second LED package.

According to another aspect, there is provided a backlight assembly including: a light source unit; a light source unit fixing member having a surface on which the light source unit is disposed; and a housing accommodating the light source unit fixing member, wherein the light source unit includes a first LED package and a second LED package which are adjacent to each other, wherein each of the first LED package and the second LED package includes an LED chip, a lead frame which supplies current to the LED chip, and a housing which fixes the LED chip and the lead frame in place, wherein an end of the lead frame of the first LED package directly contacts an end of the lead frame of the second LED package.

BRIEF DESCRIPTION OF THE DRAWINGS

The above and other aspects and features will become more apparent by describing exemplary embodiments thereof with reference to the attached drawings, in which.

DETAILED DESCRIPTION OF THE INVENTION

Figure 1:
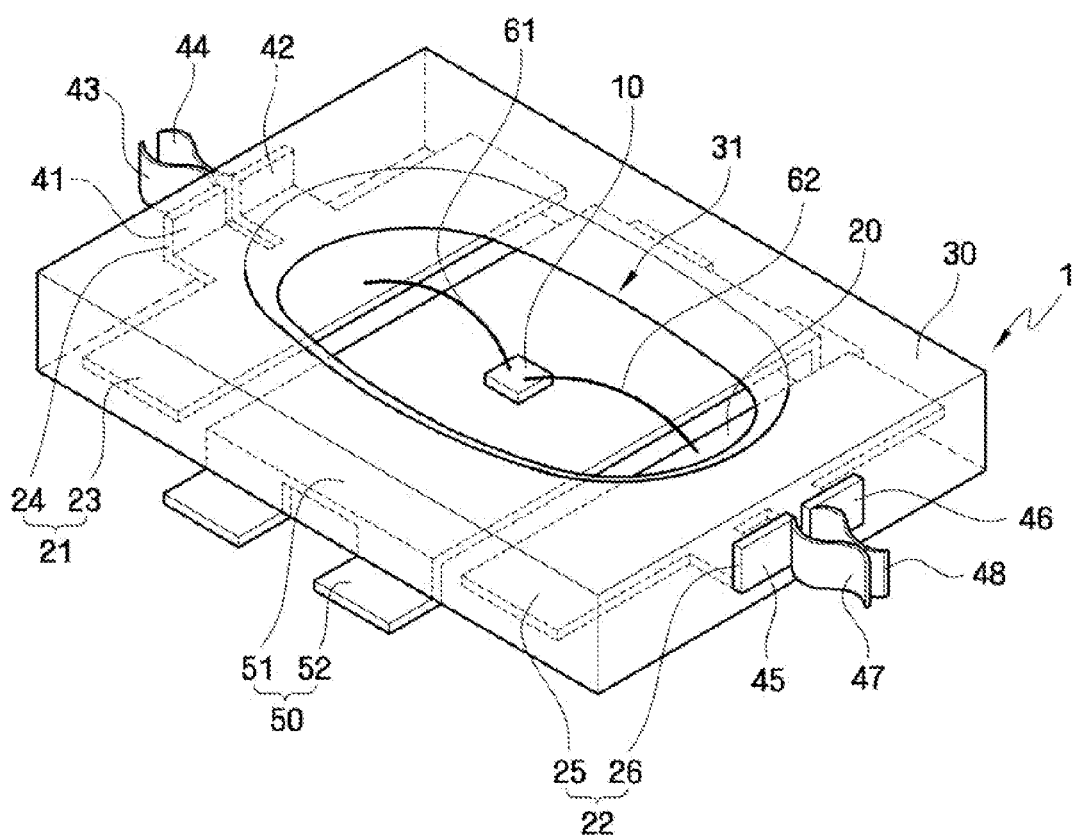
FIG. 1 is a perspective view of a light-emitting diode (LED) package according to an exemplary embodiment.

Advantages and features and methods of accomplishing the same may be understood more readily by reference to the following description of exemplary embodiments and the accompanying drawings. The present invention may, however, be embodied in many different forms and should not be construed as being limited to the embodiments set forth herein. Rather, these embodiments are provided so that this disclosure will fully convey the concept of the invention to those skilled in the art. In some embodiments, processes, structures, and technologies that are well-known to persons of ordinary skill in the relevant art will not be specifically described. Like reference numerals refer to like elements throughout the specification.

Spatially relative terms, such as "below", "beneath", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" or "beneath" other elements or features would then be oriented "above" the other elements or features. Thus, the exemplary term "below" or "beneath" can encompass both an orientation of above and below, depending on the orientation of the device. The device may be otherwise oriented and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated components, steps, operations, and/or elements, but do not preclude the presence or addition of one or more other components, steps, operations, elements, and/or groups thereof.

Unless otherwise defined, all terms (including technical and scientific terms) used herein have the same meaning as commonly understood by one of ordinary skill in the relevant art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, a light-emitting diode (LED) package according to an exemplary embodiment will be described with reference to the attached drawings.

Figure 2:
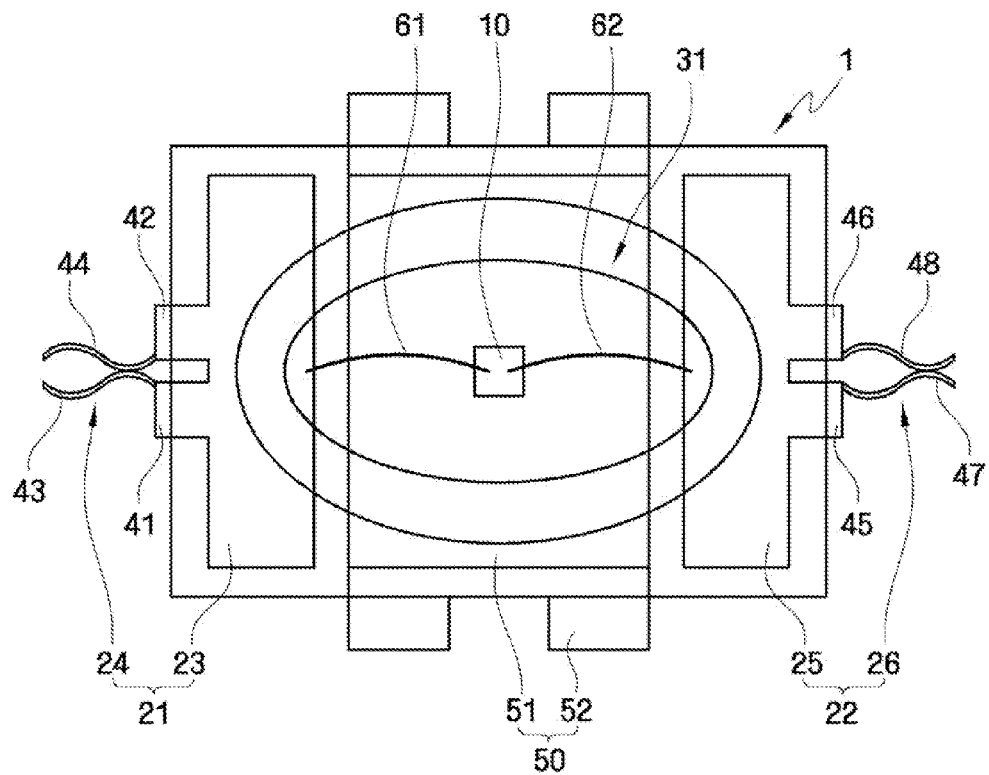
FIG. 2 is a plan view of the LED package shown in FIG. 1.
Figure 3:
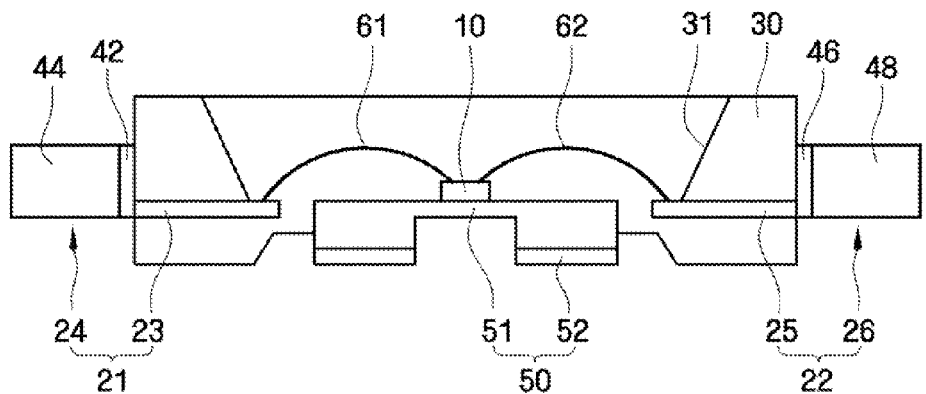
FIG. 3 is a cross-sectional view of the LED package taken along the line A-A' of FIG. 1.
Figure 4:
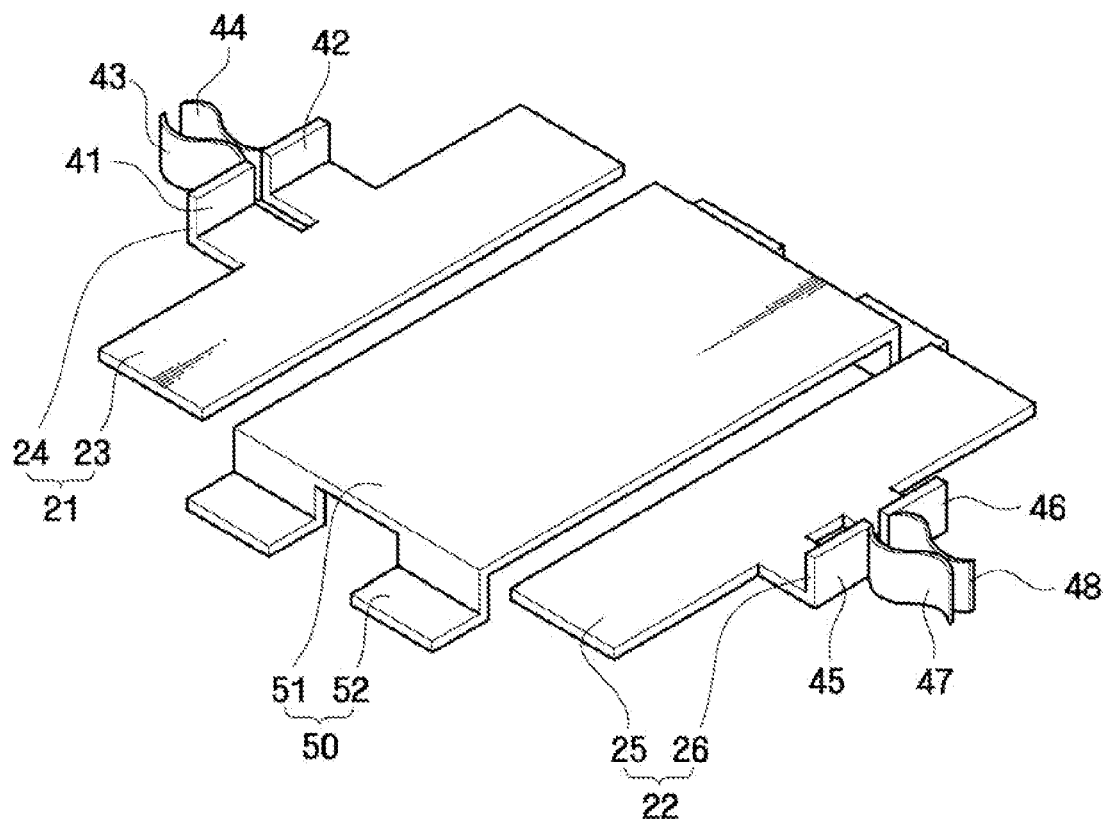
FIG. 4 is a perspective view of a lead frame and an LED mounting plate included in the LED package of FIG. 1.

FIG. 1 is a perspective view of an LED package 1 according to an exemplary embodiment. FIG. 2 is a plan view of the LED package 1 shown in FIG. 1. FIG. 3 is a cross-sectional view of the LED package 1 taken along the line A-A' of FIG. 1. FIG. 4 is a perspective view of a lead frame 20 and an LED mounting plate 50 included in the LED package 1 of FIG. 1.

Referring to FIGS. 1 through 4, the LED package 1 includes an LED chip 10, the lead frame 20 which supplies current to the LED chip 10, and a housing 30 which fixes the lead frame 20 and the LED chip 10 in place.

The housing 30 has a receiving groove 31 in which the LED chip 10 is received. The receiving groove 31 may have inclined side surfaces. The housing 30 may be formed using an organic material having excellent light fastness (i.e., is highly resistant to damage and/or degradation upon exposure to light), such as, for example, silicon resin, epoxy resin, acrylic resin, urea resin, fluorine resin or imide resin, or an inorganic material having excellent light fastness such as, for example glass or silica gel. In addition, heat-resistant resin may be used to avoid a situation where resin is melted by heat during the process of manufacturing the housing 30. To alleviate the amount of degradation that may be caused by heat stress to the resin, various fillers, such as, for example, aluminum nitride, aluminum oxide, and a complex mixture of these materials, may also be added to the material used to form housing 30.

The lead frame 20, which supplies current to the LED chip 10, includes a first sub lead frame 21 and a second sub lead frame 22. The first sub lead frame 21 and the second sub lead frame 22 are separated from each other. The LED chip 10 is electrically connected to the first sub lead frame 21 and the second sub lead frame 22 by wires 61 and 62, respectively. The lead frame 20 may be formed of a material having superior thermal and electrical conductivity, such as, for example, iron, nickel, aluminum, copper, or silver. Alternatively, the lead frame 20 may be formed by plating aluminum with silver.

The first sub lead frame 21 and the second sub lead frame 22 respectively include internal leads 23 and 25, which are disposed within the housing 30, and connecting terminals 24 and 26, which are respectively disposed on outer surfaces of two of sidewalls of the housing 30. The internal leads 23 and 25 may be integrally connected to the connecting terminals 24 and 26.

The internal leads 23 and 25 may be shaped like, for example, flat plates. The connecting terminal 24 of the first sub lead frame 21 may include connecting plates 41 and 42 and first and second arms 43 and 44. Connecting plates 41 and 42 are typically substantially perpendicular to the internal lead 23 and are disposed on the outer surface of one of the sidewalls of the housing 30. First and second arms 43 and 44 typically face each other and are coupled respectively to the connecting plates 41 and 42. The connecting terminal 26 of the second sub lead frame 22 may also include connecting plates 45 and 46 and first and second arms 47 and 48, and first and second arms 47 and 48 also typically face each other and are coupled respectively to the connecting plates (45 and 46.

For example, the connecting terminal 24 of the first sub lead frame 21 of a first LED package may be a connecting terminal that is inserted into a connecting terminal of a sub lead frame of a second LED package that is adjacent to the first LED package, and the connecting terminal 26 of the second sub lead frame 22 of the first LED package may be a connecting terminal into which a connecting terminal of a sub lead frame of a third LED package adjacent to the first LED package is inserted. In this case, the first and second arms 43 and 44 of the connecting terminal 24 of the first sub lead frame 21 may be open such that ends of the first and second arms 43 and 44 that are opposite those ends connected to the connecting plates 41 and 42 are spaced apart from each other with a predetermined gap therebetween. In addition, the first and second arms 47 and 48 of the connecting terminal 26 of the second sub lead frame 22 may be bent such that near the ends of the first and second arms 47 and 48 that are opposite those ends connected to the connecting plates 45 and 46 the first and second arms 47 and 48 contact each other.

The first arms 43 and 47 and the second arms 44 and 48 of the connecting terminals 24 and 26 can be elastically deformed. The connecting terminals 24 and 26 may be disposed on the outer surface of one of the sidewalls of the housing 30 such that a bottom surface of each of the connecting terminals 24 and 26 is separated from a bottom surface of the housing 30 by a predetermined distance.

The LED mounting plate 50 is interposed between the first sub lead frame 21 and the second sub lead frame 22, and the LED chip 10 is mounted on the LED mounting plate 50. The LED chip 10 may be electrically connected to the first and second sub lead frames 21 and 22 by the wires 61 and 62, respectively. The LED mounting plate 50 may be separated and electrically insulated from the first and second sub lead frames 21 and 22.

The LED mounting plate 50 includes an LED mounting region 51 which is disposed within the housing 30 and dummy region 52 which extend from a side of the LED mounting region 51 and protrude out of the housing 30. The dummy region 52 may protrude from the outer surface of one or both of the two of the sidewalls of the housing 30 on which the connecting terminals 24 and 26 are not disposed. The dummy region 52 may be divided into two parts (as shown in the drawings). However, the present invention is not limited thereto, and the dummy region 52 may be shaped like a single plate.

The dummy region 52 may dissipate heat generated by the LED chip 10 out of the housing 30 and may be used to fix the LED package 1 to a light source unit fixing member which will be described later. Heat dissipation efficiency may be increased by exposing a portion of a bottom surface of the LED mounting region 51 the housing 30.

The LED mounting plate 50 may be bent in the vicinity of each of the two sidewalls of the housing 30, and a top surface of the LED mounting region 51 may be higher than a top surface of the dummy region 52. Alternatively, the LED mounting plate 50 may be shaped like a flat plate.

The LED mounting plate 50 may be made of the same material as the lead frame 20. In addition, the LED mounting plate 50 and the lead frame 20 may be formed by molding and may be formed simultaneously.

Figure 5:
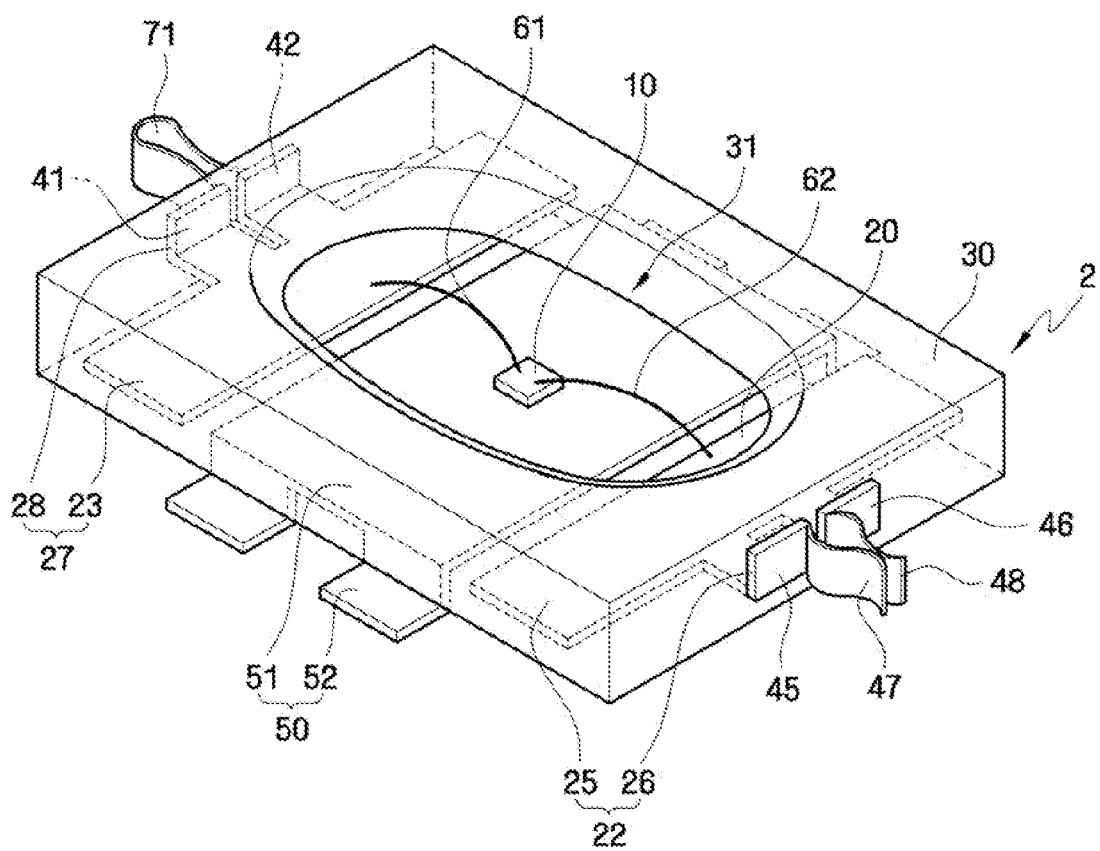
FIG. 5 is a perspective view of an LED package according to another exemplary embodiment.

Hereinafter, an LED package according to another exemplary embodiment will be described in detail with reference to FIG. 5. FIG. 5 is a perspective view of an LED package 2 according to another exemplary embodiment. For simplicity, elements substantially similar to those of the previous embodiment are indicated by like reference numerals, and thus their description will be omitted.

In the LED package 2 according to the current exemplary embodiment, a connecting terminal 28 of a first sub lead frame 27 includes connecting plates 41 and 42 which are disposed on an outer surface of a sidewall of a housing 30, and a bar 71 which is coupled to the connecting plates 41 and 42. An end of the bar 71 may have a curved surface so as to be easily inserted into a connecting terminal of an adjacent LED package.

Figure 6:
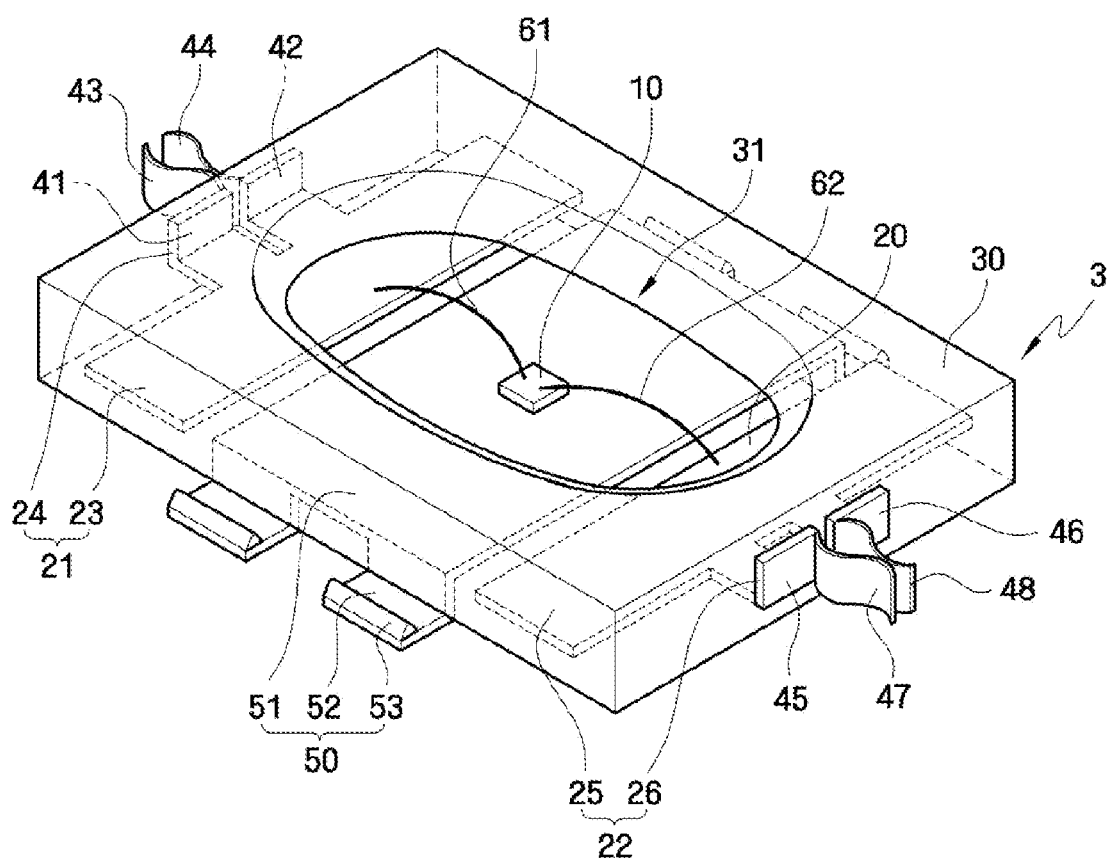
FIG. 6 is a perspective view of an LED package according to another exemplary embodiment.

Hereinafter, an LED package according to another exemplary embodiment will be described in detail with reference to FIG. 6. FIG. 6 is a perspective view of an LED package 3 according to another exemplary embodiment. For simplicity, elements substantially similar to those of the previous embodiments are indicated by like reference numerals, and thus their description will be omitted.

Figure 17:
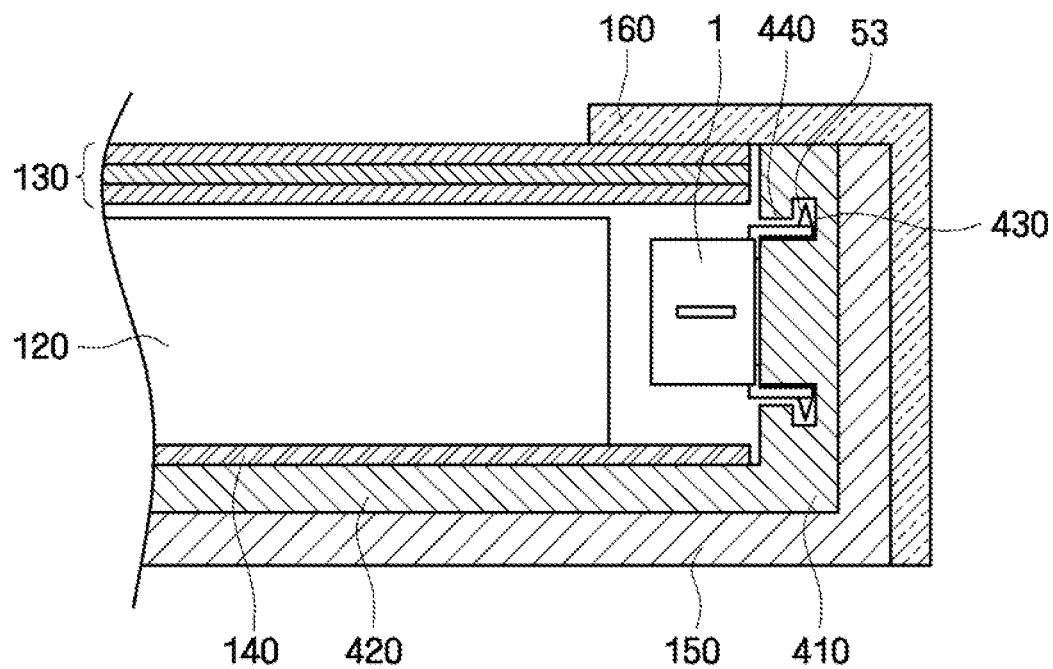
FIG. 17 is a cross-sectional view of a backlight assembly according to another exemplary embodiment.
Figure 18:
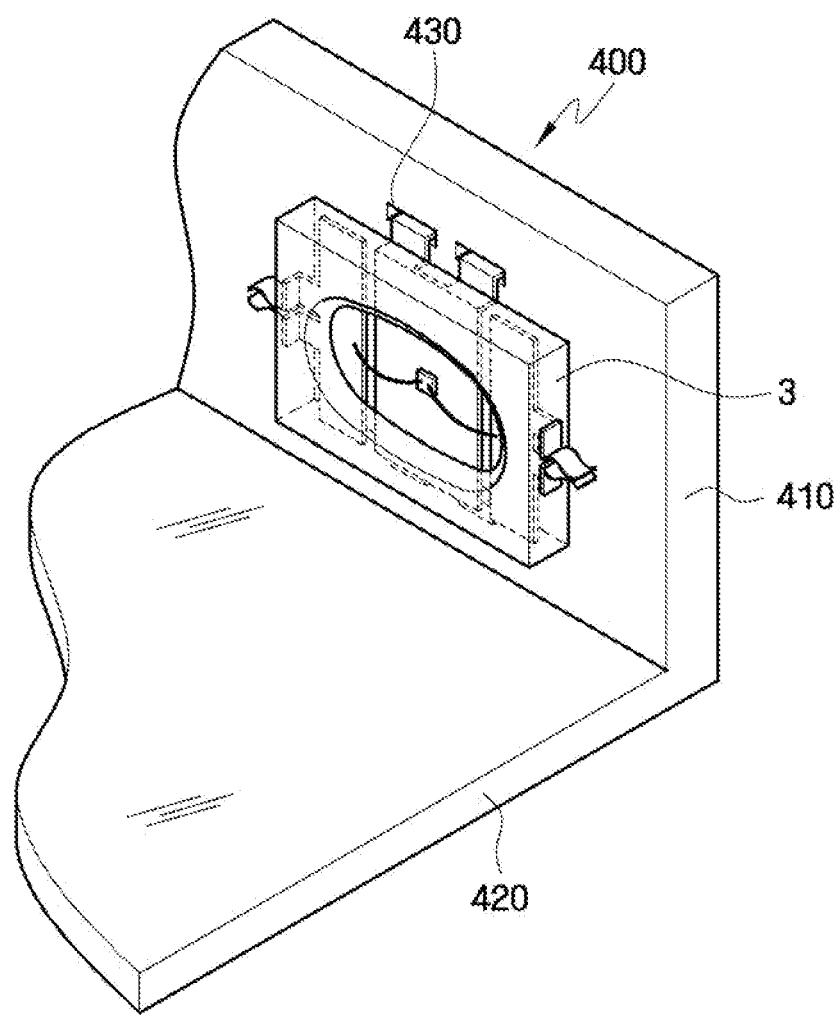
FIG. 18 is a perspective view of a light source unit fixed to a light source unit fixing member.

In the LED package 3 according to the current exemplary embodiment, a protrusion 53 is formed on an end of each dummy region 52. Referring to FIGS. 17 and 18, which will be described later, the protrusion 53 is used to fix an LED package 1 to a light source unit fixing member 400.

Figure 7:
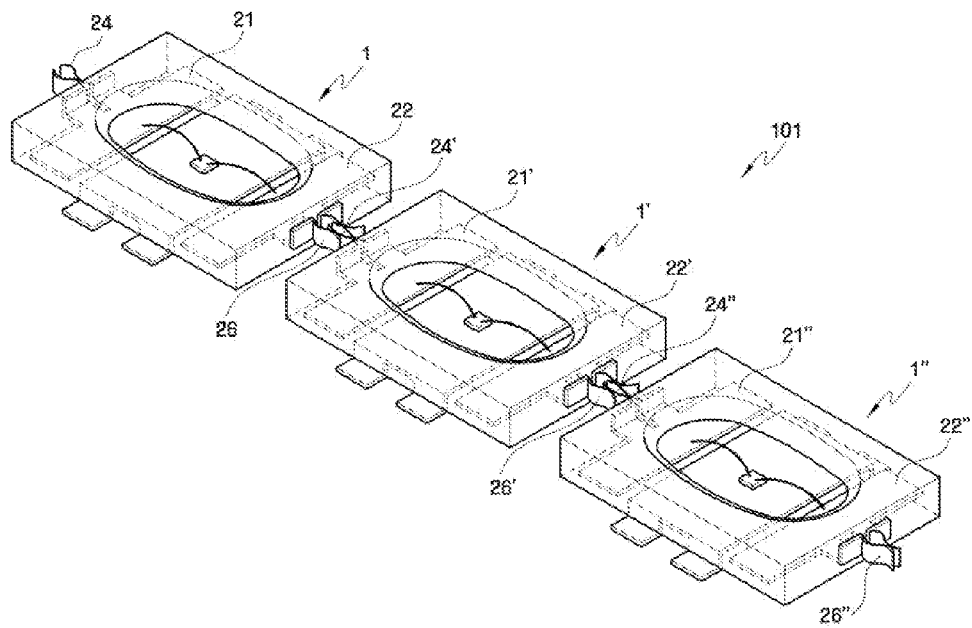
FIG. 7 is a perspective view of a light source unit according to an exemplary embodiment.
Figure 8:
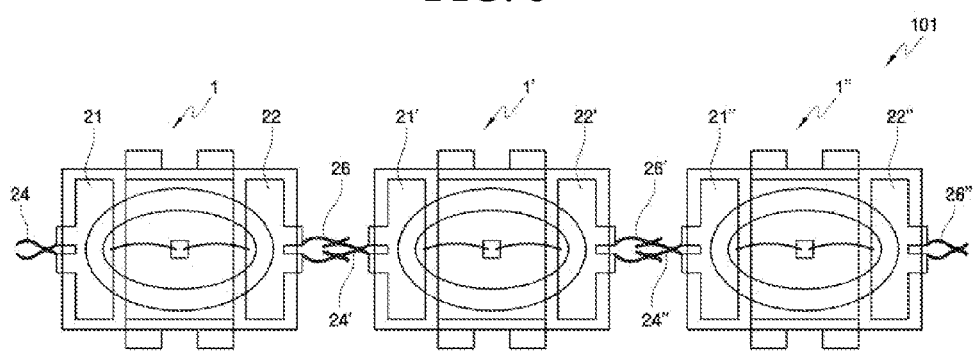
FIG. 8 is a plan view of the light source unit shown in FIG. 7.
Figure 9:
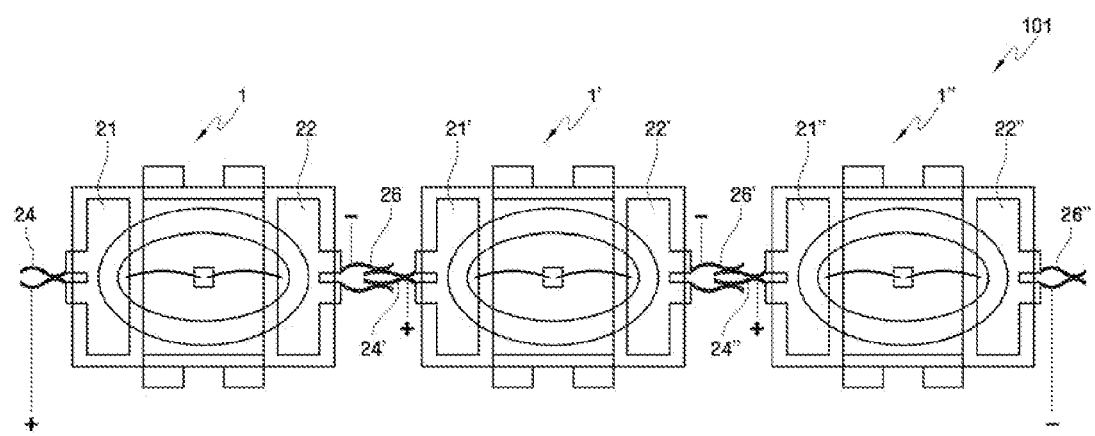
FIG. 9 illustrates the light source unit of FIG. 8 to which external power has been supplied.

Hereinafter, a light source unit including a plurality of LED packages according to an exemplary embodiment will be described in detail with reference to FIGS. 7 through 9. FIG. 7 is a perspective view of a light source unit 101 according to an exemplary embodiment. FIG. 8 is a plan view of the light source unit 101 shown in FIG. 7. FIG. 9 illustrates the light source unit 101 of FIG. 8 to which external power has been supplied.

Referring to FIGS. 7 through 9, the light source unit 101 includes first through third LED packages 1, 1', and 1". The first through third LED packages 1, 1' and 1" may be any one of the LED packages 1 through 3 according to the exemplary embodiments. The following description is based on a case where the light source unit 101 includes a plurality of LED packages 1 shown in FIG. 1.

An end of a lead frame of the first LED package 1 directly contacts an end of a lead frame of the second LED package 1'. Specifically, a connecting terminal 24' of a first sub lead frame 21' of the second LED package 1' is inserted into a connecting terminal 26 of a second sub lead frame 22 of the first LED package 1. Because first and second arms (43, 44, 47 and 48 in FIG. 1) of the connecting terminals 24' and 24 are elastically deformable, the connecting terminal 24' of the first sub lead frame 21' of the second LED package 1' can be inserted into the connecting terminal 26 of the second sub lead frame 22 of the first LED package 1. After insertion, the elastically deformed first and second arms(43 and 44 in FIG. 1) of the connecting terminal 24' of the second LED package 1' directly contact predetermined regions of the elastically deformed first and second arms (47 and 48 in FIG. 1) of the connecting terminal 26 of the first LED package 1. A connecting terminal 24" of a first sub lead frame 21" of the third LED package 1" is inserted into a connecting terminal 26' of a second sub lead frame 22' of the second LED package 1'.

The first through third LED packages 1, 1' and 1" arranged as described above in the light source unit 101 can be directly electrically connected to each other without the help of a printed circuit board (PCB), wires, or the like. Power from an external source can be supplied to the light source unit 101. More specifically, when one (e.g., positive power) of positive power or negative power is supplied from an external source to the connecting terminal 24 of the first sub lead frame 21 of the first LED package 1 and when the other one (e.g., negative power) of the positive power or the negative power is supplied from the external source to a connecting terminal 26" of a second sub lead frame 22" of the third LED package 1", the first through third LED packages 1, 1' and 1" are coupled to each other on the same principle as connectors and thus are directly electrically connected to each other. In this case, the connecting terminals 24, 24' and 24" of the first sub lead frames 21, 21' and 21" of the first through third LED packages 1, 1' and 1" serve as positive poles, and the connecting terminals 26, 26' and 26" of the second sub lead frames 22, 22' and 22" of the first through third LED packages 1, 1' and 1" serve as negative poles.

Figure 10:
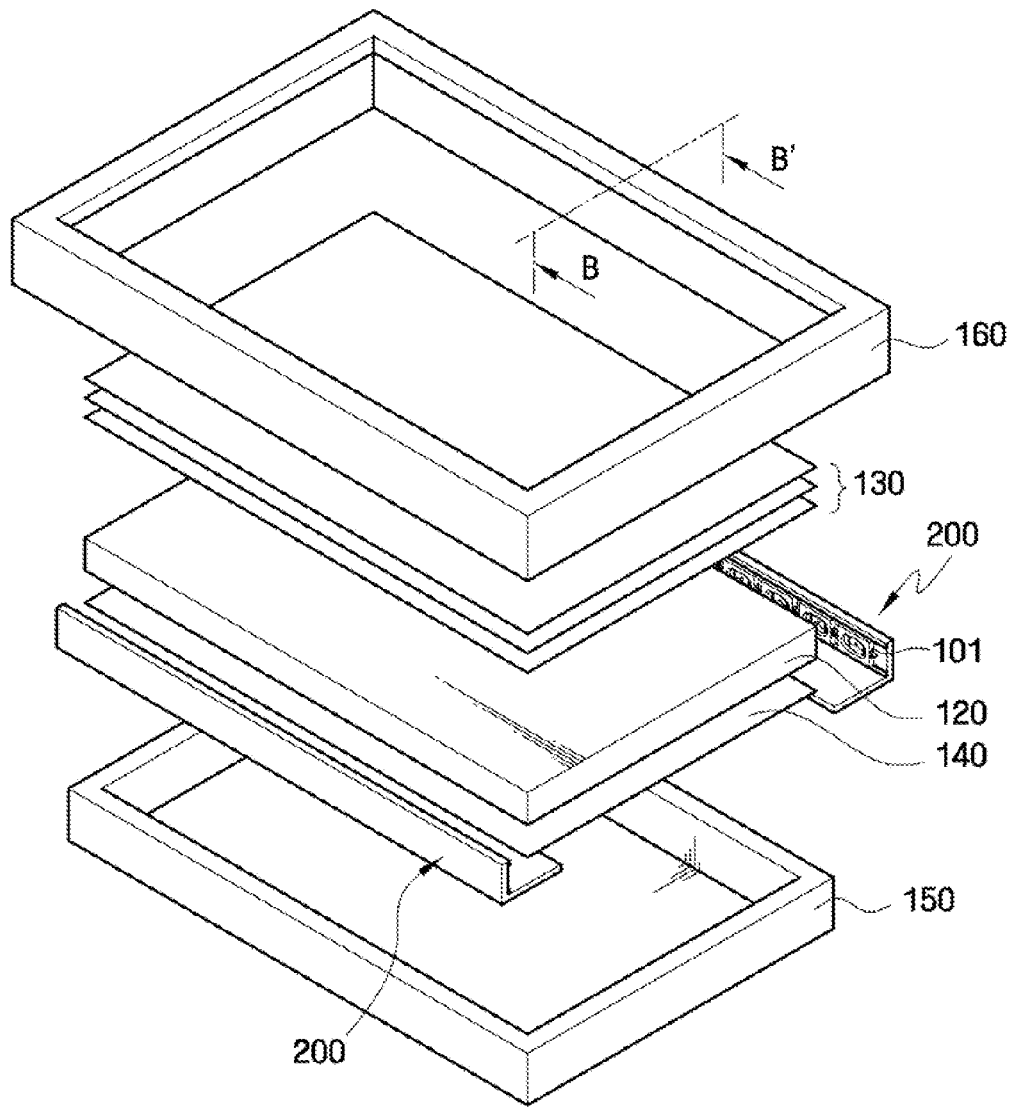
FIG. 10 is an exploded perspective view of a backlight assembly according to an exemplary embodiment.
Figure 11:
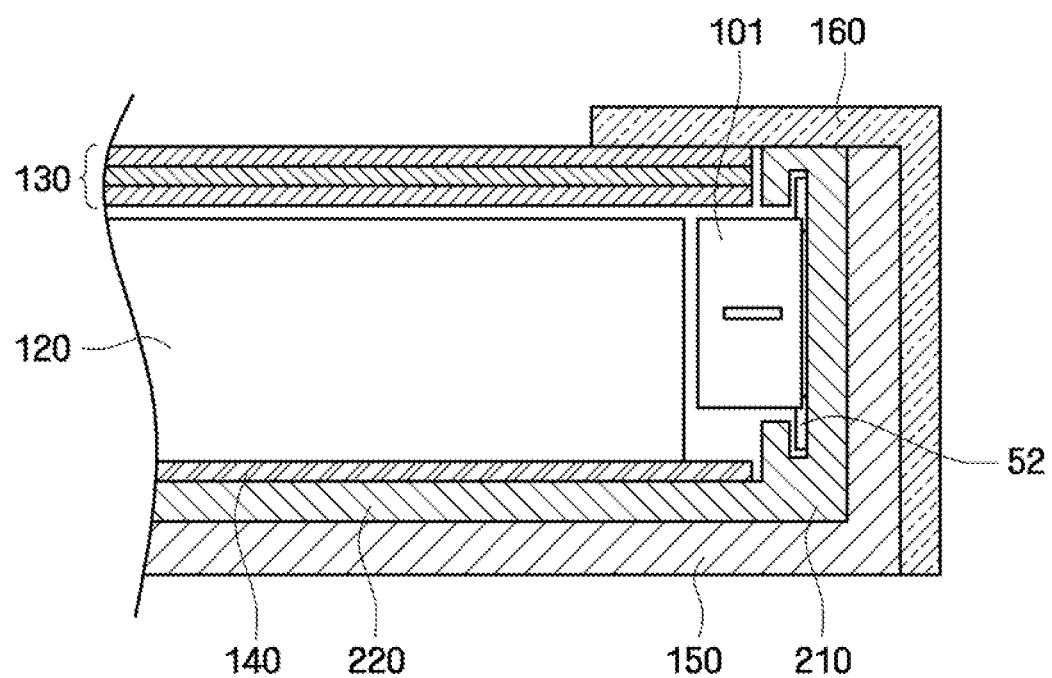
FIG. 11 is a cross-sectional view of the backlight assembly taken along the line B-B' of FIG. 10.
Figure 12:
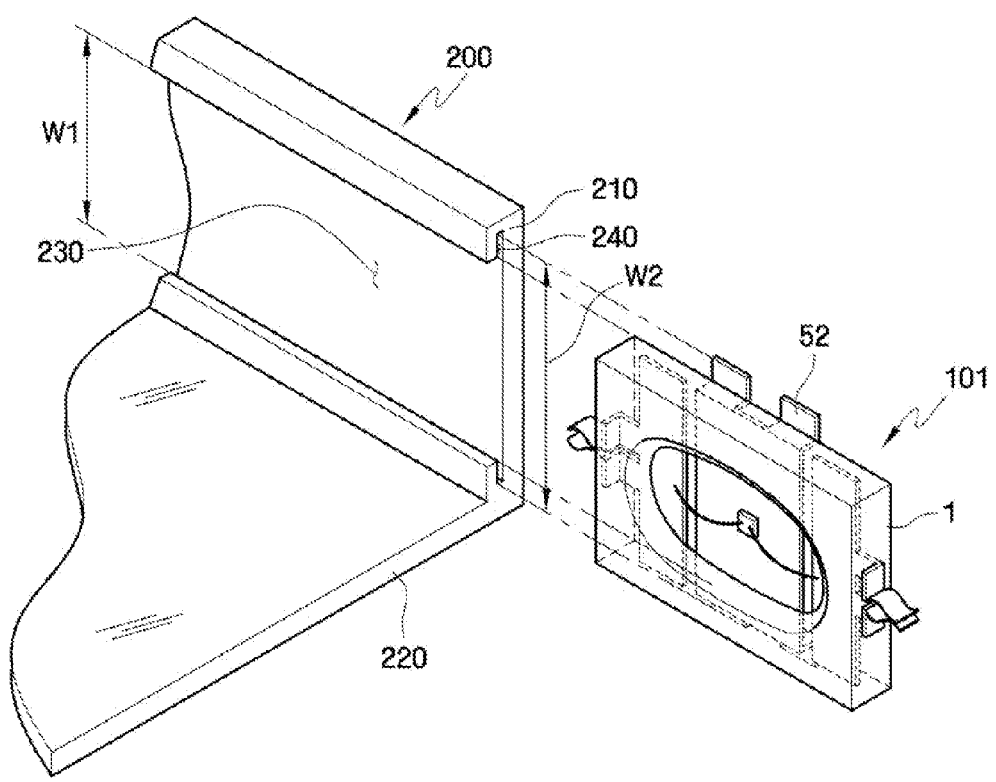
FIG. 12 is a perspective view for explaining a method of coupling an LED package to a light source unit fixing member.
Figure 13:
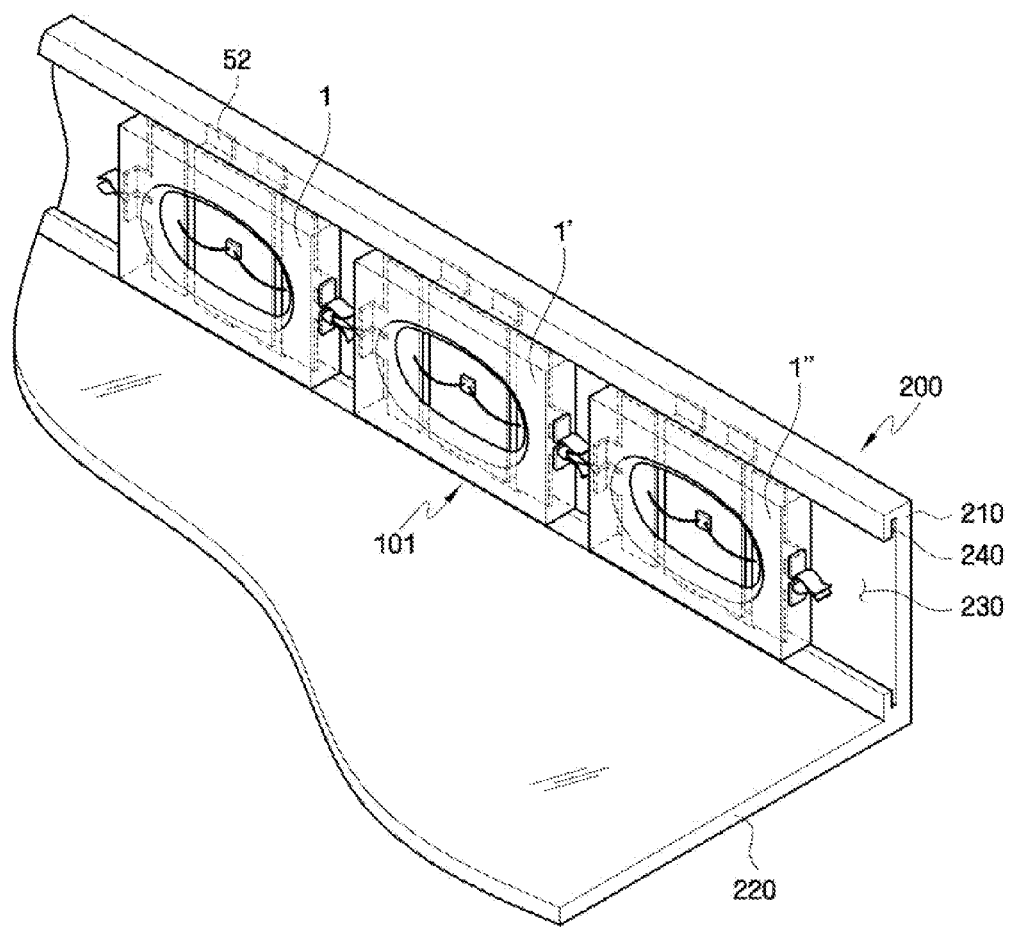
FIG. 13 is a perspective view of a light source unit fixed to the light source unit fixing member.

Hereinafter, a backlight assembly according to an exemplary embodiment will be described with reference to FIGS. 10 through 13. FIG. 10 is an exploded perspective view of a backlight assembly according to an exemplary embodiment. FIG. 11 is a cross-sectional view of the backlight assembly taken along the line B-B' of FIG. 10. FIG. 12 is a perspective view for explaining a method of coupling an LED package to a light source unit fixing member 200. FIG. 13 is a perspective view of a light source unit 101 fixed to the light source unit fixing member 200.

Referring to FIGS. 10 through 13, the backlight assembly according to the current exemplary embodiment includes the light source unit 101, the light source unit fixing member 200 to which the light source unit 101 is fixed, a light guide plate (LGP) 120, one or more optical sheets 130, a reflective sheet 140, a first housing 150, and a second housing 160.

The light source unit 101 described in the embodiment of FIGS. 7 through 9 is used as the light source unit 101 according to the current exemplary embodiment. The light source unit 101 includes a plurality of LED packages 1, 1' and 1". In the current exemplary embodiment, the light source unit 101 is disposed on two opposite side surfaces of the LGP 120. However, the present invention is not limited thereto, and the light source unit 101 may also be disposed on any one or all of the four sides of the LGP 120.

The LGP 120 is housed in the first housing 150 such that each of the two opposite side surfaces thereof faces the light source unit 101. When the light source unit 101 is disposed on each of the two opposite side surfaces of the LGP 120, light is input to the LGP 120 through the two opposite side surfaces of the LGP 120 which face the light source unit 101. The LGP 120 guides light generated by an LED chip 10 in an upward direction, toward the upper surface of the LGP (where the upper surface of the LGP is the surface that is closest to the position of the second housing 160 in FIG. 10).

The LGP 120 may be a wedge-shaped plate or a flat plate. The LGP 120 may be made of a light-transmitting material, for example, acrylic resin (such as polymethyl methacrylate (PMMA)) or polycarbonate (PC).

A pattern may be formed on at least one surface of the LGP 120. For example, a diffusion pattern (not shown) may be formed on a lower surface of the LGP 120 such that guided light can exit from the LGP 120 in an upward direction.

The optical sheets 130 are disposed on an upper surface of the LGP 120 and diffuse and concentrate light that is received from the LGP 120. The optical sheets 130 may include a diffusion sheet, a prism sheet, and a protective sheet. Of the optical sheets 130, the diffusion sheet may be located closest to the LGP 120. The diffusion sheet may diffuse light, which is received from the LGP 120, in order to prevent the light from being concentrated in a specific area. The prism sheet may have a predetermined array of triangular prisms on a surface thereof. The protective sheet may be disposed on the prism sheet and protect a surface of the prism sheet. In addition, the protective sheet may diffuse light for uniform distribution of the light.

The reflective sheet 140 is disposed between the LGP 120 and the first housing 150 and reflects any light that may have been directed downward from the LGP 120 in an upward direction.

To be reflective, the reflective sheet 140 may be made of, for example, polyethylene terephthalate (PET). In addition, a diffusion layer containing, for example, titanium dioxide, may be coated on a surface of the reflective sheet 140. The reflective sheet 140 may also be made of metal such as, for example, silver (Ag).

The second housing 160 may be frame-shaped along sidewalls of the first housing 150, for example, along outer surfaces of the sidewalls of the first housing 150. The second housing 160 may be coupled to the first housing 150 by coupling members formed on sidewalls thereof. The second housing 160 and the first housing 150 may be coupled to each other so as to accommodate the reflective sheet 140, the LGP 120, the light source unit fixing member 200 to which the light source unit 101 is fixed, and the optical sheets 130.

The second housing 160 may be a mold frame made of, for example, a plastic material, in order to prevent parts that are fixed in place by the second housing 160 from being damaged.

The first housing 150 may be shaped like a rectangular box having an open top, and a housing space may be formed to a predetermined depth within the first housing 150.

The coupling relationship between the light source unit 101 and the light source unit fixing member 200 will now be described with reference to FIGS. 11 through 13.

Referring to FIGS. 11 through 13, the light source unit fixing member 200 includes a fixing plate 220 and a fixing wall 210 which is substantially perpendicular to the fixing plate 220. The fixing plate 220 may be parallel to a bottom surface of the first housing 150, and the fixing wall 210 may be parallel to a sidewall of the first housing 150.

The light source unit 101 is disposed on the fixing wall 210. An aperture 230 is continuously formed in a surface of the fixing wall 210 along a lengthwise direction of the light source unit fixing member 200. In addition, grooves 240 are respectively formed in inner surfaces of opposite sidewalls of the aperture 230 along the lengthwise direction of the light source unit fixing member 200. As dummy regions 52 of the LED package 1 are inserted into the grooves 240, the LED package 1 is fixed to the light source unit fixing member 200.

The dummy regions 52 of the LED package 1 may be inserted into the grooves 240 in a sliding manner.

A width W1 of an entrance portion of the aperture 230 is at least equal to a width of a housing 30 of the LED package 1 and is smaller than the sum of the width of the housing 30 and widths of the dummy regions 52. On the other hand, the width W2 of the other portion of the aperture 230, which includes the grooves 240, is equal to or greater than the sum of the width of the housing 30 and the widths of the dummy regions 52. Because the dummy regions 52 inserted into the grooves 240 cannot slip from the entrance portion of the aperture 230, the LED package 1 can be fixed to the light source unit fixing member 200 without using coupling members such as screws.

The LED packages 1, 1' and 1" are connected to each other in the same way as described above with reference to FIGS. 7 through 9. Because the LED packages 1, 1' and 1" do not need a PCB or the like to be electrically connected to each other, they can be mounted directly on the light source unit fixing member 200.

The light source unit fixing member 200 may be a heat dissipating member that dissipates heat generated by the light source unit 101. In this case, the light source unit fixing member 200 may be formed by extrusion of, for example, aluminum having superior thermal conductivity.

Figure 14:
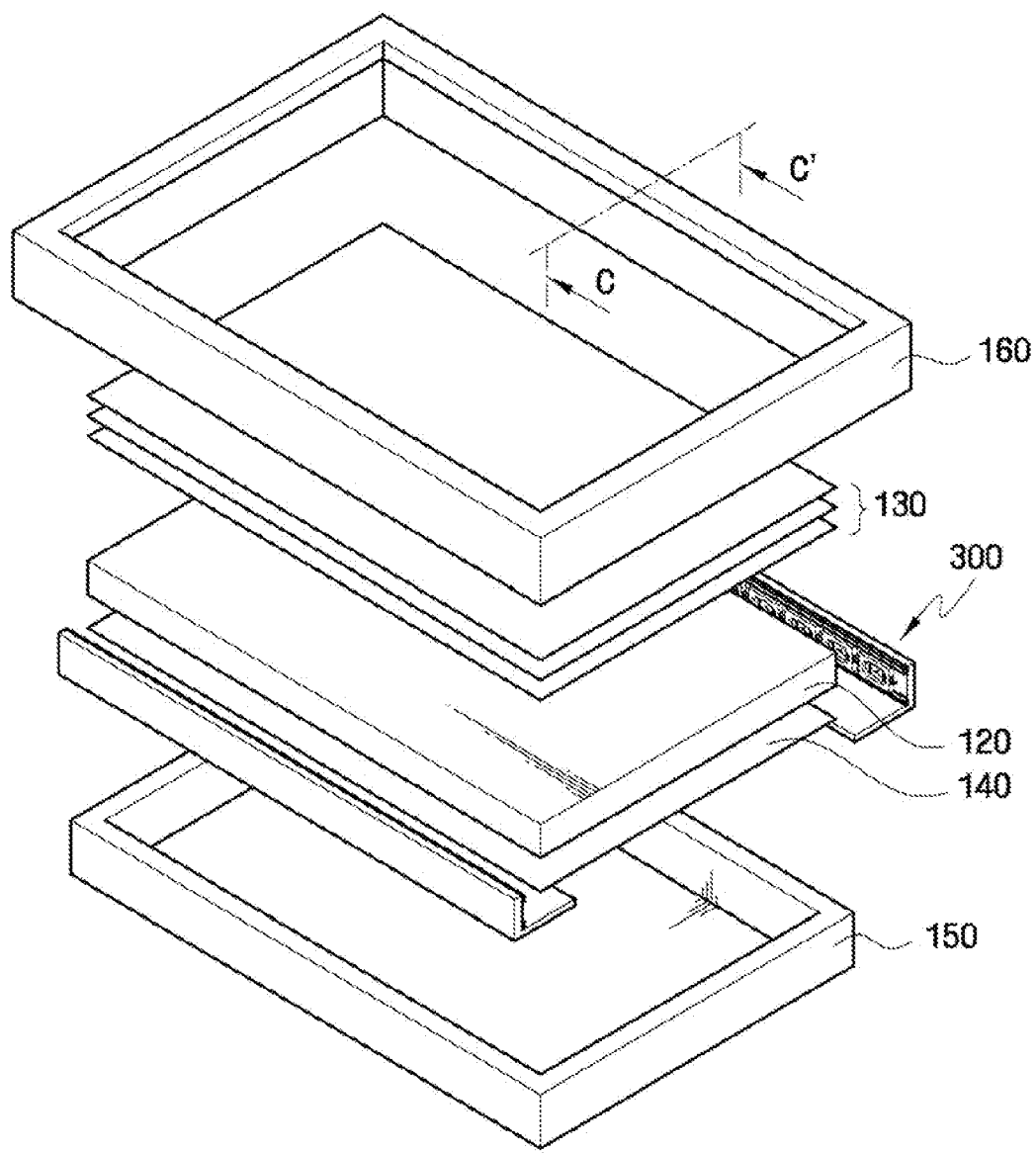
FIG. 14 is an exploded perspective view of a backlight assembly according to another exemplary embodiment.
Figure 15:
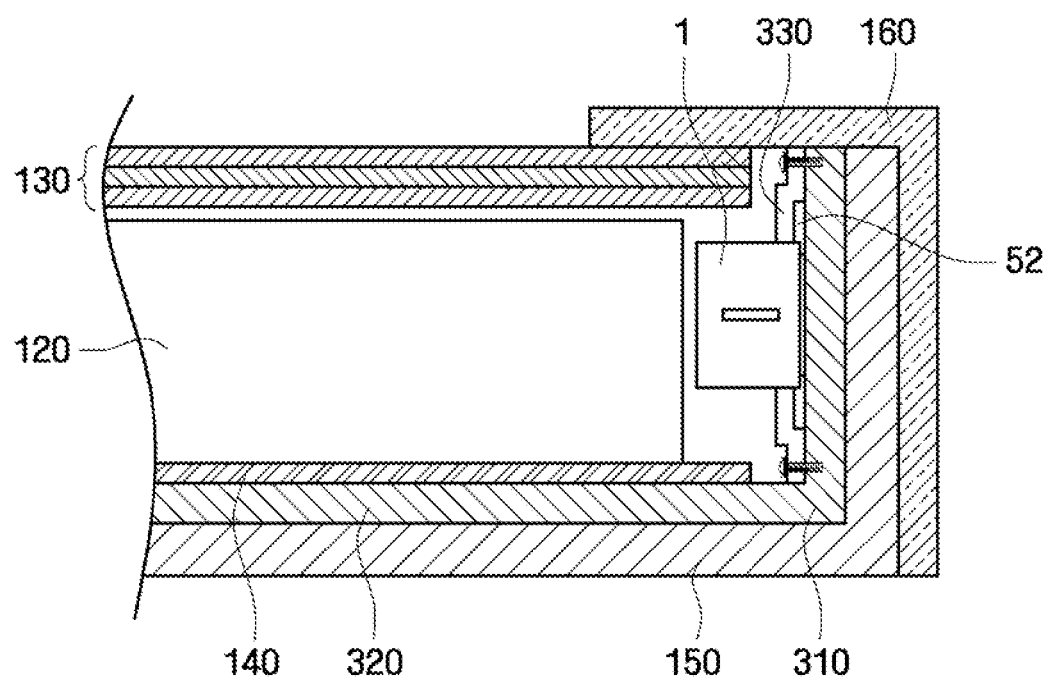
FIG. 15 is a cross-sectional view of the backlight assembly taken along the line C-C' of FIG. 14.
Figure 16:
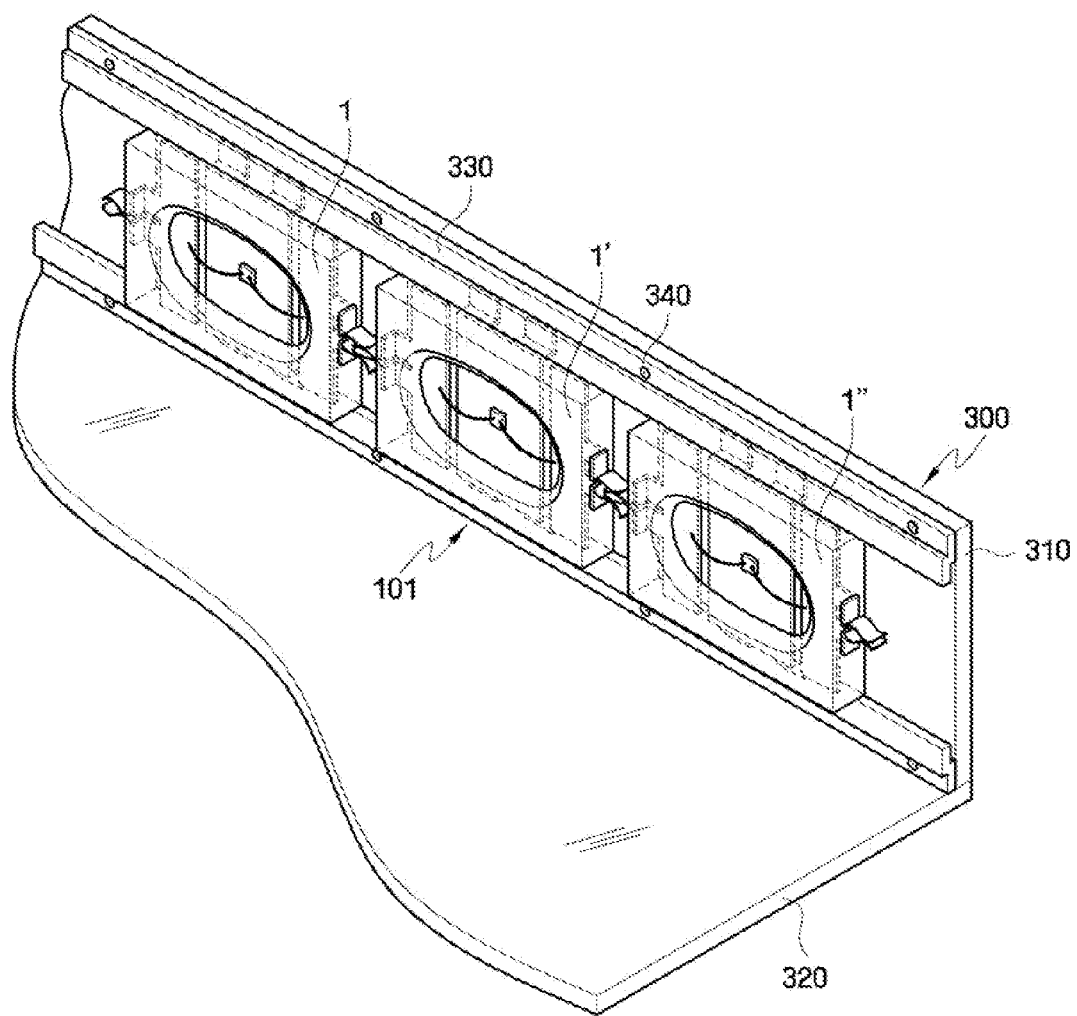
FIG. 16 is a perspective view of a light source unit fixed to a light source unit fixing member.

Hereinafter, a backlight assembly according to another exemplary embodiment will be described with reference to FIGS. 14 through 16. FIG. 14 is an exploded perspective view of a backlight assembly according to another exemplary embodiment. FIG. 15 is a cross-sectional view of the backlight assembly taken along the line C-C' of FIG. 14. FIG. 16 is a perspective view of a light source unit 101 fixed to a light source unit fixing member 300. For simplicity, elements substantially similar to those of the previous embodiment are indicated by like reference numerals, and thus their description will be omitted.

Referring to FIGS. 14 through 16, the light source unit 101 is disposed on a surface of a fixing wall 310. A pair of auxiliary light source unit fixing members 330 are disposed on dummy regions 52 of each of a plurality of LED packages 1, 1' and 1". The auxiliary light source unit fixing members 330 surround top and side surfaces of the dummy regions 52 and contact the fixing wall 310. The auxiliary light source fixing members 330 may be fixed to the fixing wall 310 by screws 340. As the auxiliary light source unit fixing members 330 which surround the top and side surfaces of the dummy regions 52 are fixed to the fixing wall 310, the dummy regions 52 of each of the LED packages 1, 1' and 1" are fixed to the fixing wall 310. Accordingly, the LED packages 1, 1' and 1" can be fixed to the light source unit fixing member 300.

The LED packages 1, 1' and 1" are connected to each other in the same way as described above with reference to FIGS. 7 through 9. Because the LED packages 1, 1' and 1" do not need a PCB or the like to be electrically connected to each other, they can be mounted directly on the light source unit fixing member 300.

Hereinafter, a backlight assembly according to another exemplary embodiment will be described in detail with reference to FIGS. 17 and 18. FIG. 17 is a cross-sectional view of a backlight assembly according to another exemplary embodiment. FIG. 18 is a perspective view of a light source unit fixed to a light source unit fixing member 400. For simplicity, elements substantially similar to those of the previous embodiments are indicated by like reference numerals, and thus their description will be omitted.

Referring to FIGS. 17 and 18, the light source unit is disposed on a surface of a fixing wall 410. In the current exemplary embodiment, the light source unit includes a plurality of LED packages identical to the LED package 3 shown in FIG. 6. Coupling holes 430 are formed in the surface of the fixing wall 410 to correspond to dummy regions of the LED package 3. As the dummy regions are inserted into the coupling holes 430, the LED package 3 is fixed to the fixing wall 410. Each of the coupling holes 430 has a protruding portion 440 formed at an entrance thereof. Once the dummy regions, each having a protrusion 53, are inserted into the coupling holes 430 after passing the protruding portion 440 of each of the coupling holes 430 by being elastically deformed, they cannot slip out of the coupling holes 430 since the protrusion 53 is caught on the protruding portion 440. Accordingly, the LED package 3 can be fixed to the light source unit fixing member 400.

A plurality of LED packages 3 are connected to each other in the same way as described above with reference to FIGS. 7 through 9. Because the LED packages 3 do not need a PCB or the like to be electrically connected to each other, they can be mounted directly on the light source unit fixing member 400.

Figure 19:
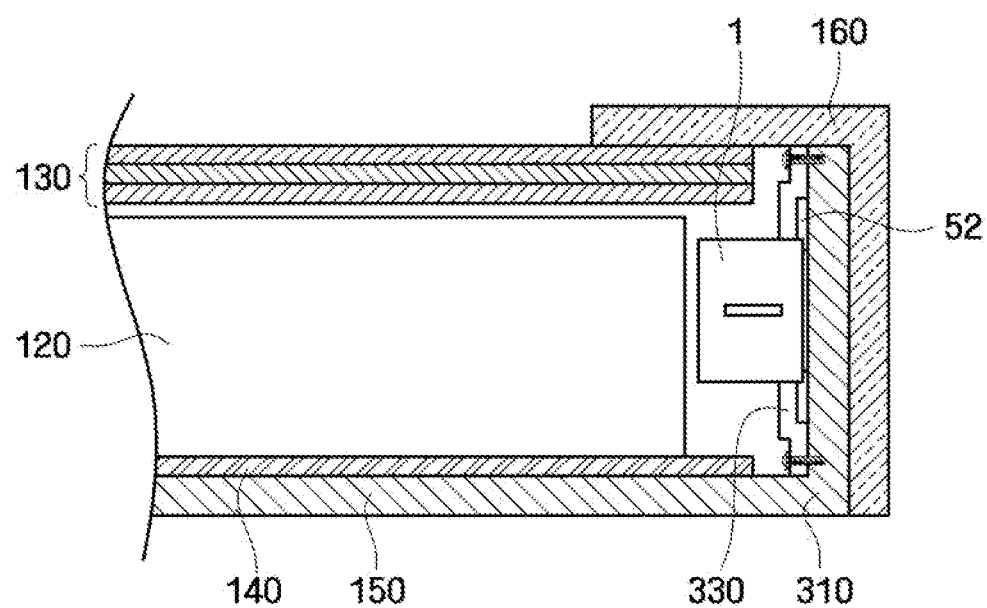
FIG. 19 is a cross-sectional view of a backlight assembly according to another exemplary embodiment.

Hereinafter, a backlight assembly according to another exemplary embodiment will be described with reference to FIG. 19. FIG. 19 is a cross-sectional view of a backlight assembly according to another exemplary embodiment. For simplicity, elements substantially similar to those of the previous embodiments are indicated by like reference numerals, and thus their description will be omitted.

Referring to FIG. 19, unlike in the backlight assembly shown in FIG. 15, in the backlight assembly according to the current exemplary embodiment, LED packages 1 are directly fixed to an inner surface of a sidewall of first housing 150. Specifically, the LED packages 1 are disposed on the inner surface of the sidewall of the first housing 150, and auxiliary light source unit fixing members 330 are disposed on dummy regions 52 of the LED packages 1. Then, the auxiliary light source unit fixing members 330 are fixed to the inner surface of the sidewall of the first housing 150. Accordingly, the LED packages 1 are fixed to the first housing 150. The auxiliary light source unit fixing members 330 may be fixed to the inner surface of the sidewall of the first housing 150 by screws.

In FIG. 19, the LED packages 1 are fixed to the first housing 150 by using the auxiliary light source unit fixing members 330. However, the present invention is not limited thereto. The LED packages 1 may also be fixed to the first housing 150 by applying any one of the shapes of the light source unit fixing members 200 through 400 described above with reference to FIGS. 10 through 18 to the first housing 150.

In the exemplary embodiments, a light source unit is disposed on one or more side surfaces of an LGP. However, the present invention is not limited thereto. The light source unit can also be disposed under the LGP.

Figure 20:
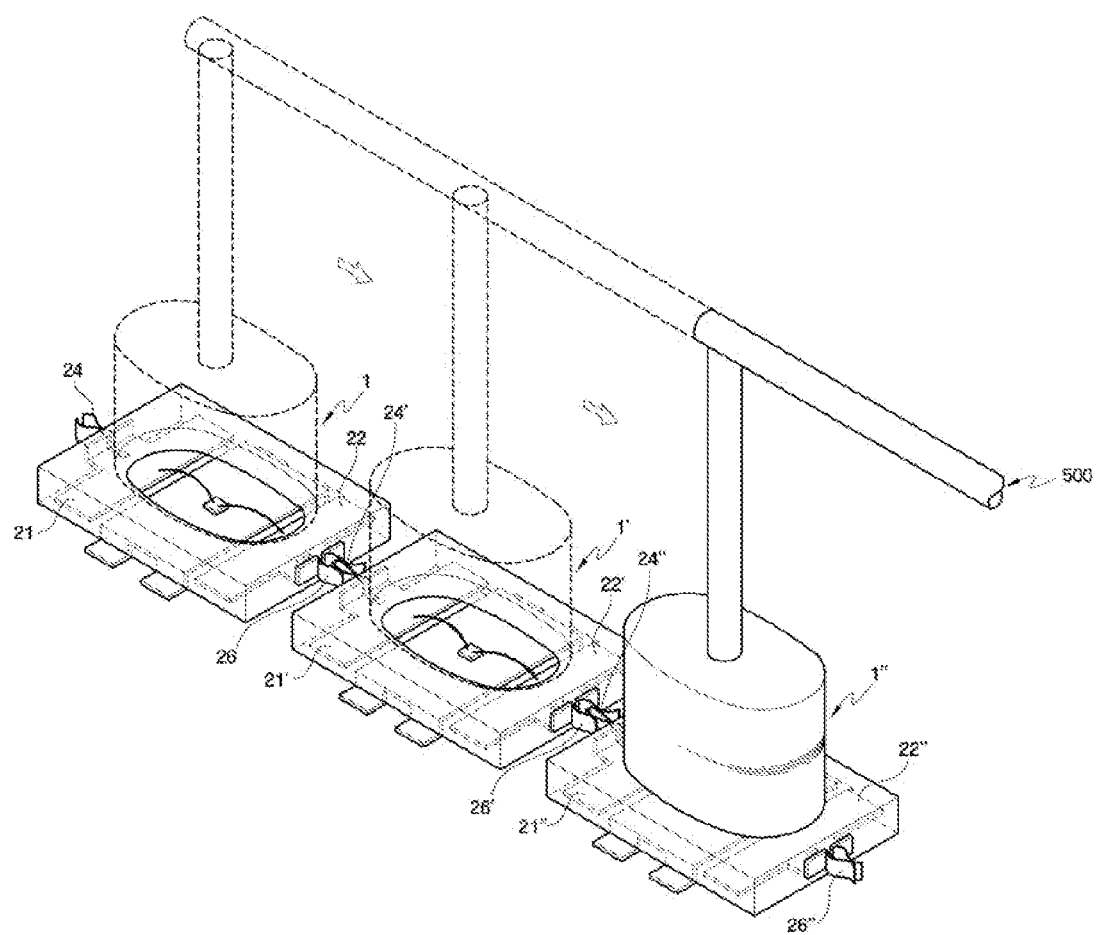
FIG. 20 is a perspective view for explaining a method of connecting LED packages to each other according to an exemplary embodiment.

Hereinafter, a method of connecting LED packages to each other according to an exemplary embodiment will be described with reference to FIG. 20. FIG. 20 is a perspective view for explaining a method of connecting LED packages to each other according to an exemplary embodiment.

Referring to FIG. 20, LED package mounting equipment 500 picks up a first LED package 1 [?] by applying a suction force to the LED package 1 and places the first LED package 1 at an input coordinate position. Then, the LED package mounting equipment 500 moves a predetermined distance and places a second LED package 1' at a corresponding coordinate position. The LED package mounting equipment 500 inserts a connecting terminal 24' of a first sub lead frame 21' of the second LED package 1' into a connecting terminal 26 of a second sub lead frame 22 of the first LED package, thereby connecting the first and second LED packages 1 and 1' to each other. Then, the LED package mounting equipment 500 moves the predetermined distance and places a third LED package 1" at a corresponding coordinate position.

While the present invention has been particularly shown and described with reference to exemplary embodiments thereof, it will be understood by those of ordinary skill in the art that various changes in form and detail may be made therein without departing from the spirit and scope of the present invention. The exemplary embodiments should be considered in a descriptive sense only and not for purposes of limitation.

What is claimed is:

1. A light source unit comprising a first light-emitting diode (LED) package and a second LED package which are adjacent to each other, wherein each of the first LED package and the second LED package comprises an LED chip, a lead frame which supplies current to the LED chip, and a housing which fixes the LED chip and the lead frame in place, wherein an end of the lead frame of the first LED package directly contacts an end of the lead frame of the second LED package, wherein the lead frame comprises a first sub lead frame and a second sub lead frame which are separated from each other, each of the first LED package and the second LED package further comprising an LED mounting plate on which the LED chip is mounted and which is interposed between the first sub lead frame and the second sub lead frame and is electrically insulated from the first sub lead frame and the second sub lead frame.

2. The light source unit of claim 1, wherein each of the first sub lead frame and the second sub lead frame comprises an internal lead which is disposed within the housing and a connecting terminal which is disposed on an outer surface of a sidewall of the housing.

3. The light source unit of claim 2, wherein the connecting terminal of the first sub lead frame of the second LED package is inserted into the connecting terminal of the second sub lead frame of the first LED package.

4. The light source unit of claim 3, wherein the connecting terminal of the first sub lead frame of the second LED package comprises a first arm and a second arm which face each other.

5. The light source unit of claim 4, wherein the connecting terminal of the second sub lead frame of the first LED package comprises a first arm and a second arm which face each other.

6. The light source unit of claim 3, wherein the connecting terminal of the first sub lead frame of the second LED package comprises a bar which extends outward from an outer surface of a sidewall of the housing.

7. The light source unit of claim 3, wherein one of positive power and negative power is supplied from an external power source to the connecting terminal of the first sub lead frame of the first LED package, and the other one of the positive power and the negative power is supplied from the external source to the connecting terminal of the second sub lead frame of the second LED package, wherein the connecting terminal of the first sub lead frame of the second LED package is electrically connected to the connecting terminal of the second lead frame of the first LED package.

8. The light source unit of claim 2, wherein the LED chip is electrically connected to each of the first and second lead frames by a wire.

9. The light source unit of claim 8, wherein the LED mounting plate comprises an LED mounting region which is disposed within the housing and dummy regions which protrude out of the housing.

10. The light source unit of claim 9, further comprising a protrusion formed on an end of each of the dummy regions.

11. A backlight assembly comprising:

a light source unit;

a light source unit fixing member having a surface on which the light source unit is disposed; and a housing accommodating the light source unit fixing member, wherein the light source unit comprises a first LED package and a second LED package which are adjacent to each other, wherein each of the first LED package and the second LED package comprises an LED chip, a lead frame which supplies current to the LED chip, and a chip housing which fixes the LED chip and the lead frame in place, wherein the lead frame comprises a connecting terminal which is disposed on an outer surface of a sidewall of the chip housing and the connecting terminal of the lead frame of the first LED package directly contacts the connecting terminal of the lead frame of the second LED package.

12. The backlight assembly of claim 11, wherein the lead frame comprises a first sub lead frame and a second sub lead frame which are separated from each other, wherein each of the first sub lead frame and the second sub lead frame comprises an internal lead which is disposed within the chip housing and the connecting terminal.

13. The backlight assembly of claim 12, wherein the connecting terminal of the first sub lead frame of the second LED package is inserted into the connecting terminal of the second sub lead frame of the first LED package.

14. The backlight assembly of claim 12, wherein the connecting terminal is separated and electrically insulated from the surface of the light source unit fixing member.

15. The backlight assembly of claim 12, wherein the light source unit further comprises an LED mounting plate on which the LED chip is mounted and which is interposed between the first sub lead frame and the second sub lead frame, wherein the LED mounting plate comprises an LED mounting region which is disposed within the chip housing and dummy regions which protrude out of the chip housing.

16. The backlight assembly of claim 15, wherein the dummy regions of the LED mounting plate directly contact the surface of the light source unit fixing member.

17. The backlight assembly of claim 15, wherein the light source unit fixing member comprises an aperture which is continuously formed in the surface of the light source unit fixing member along a lengthwise direction of the light source unit fixing member and grooves which are continuously formed respectively in inner surfaces of opposite sidewalls of the aperture, wherein the dummy regions of the LED mounting plate are inserted into the grooves so as to fix the light source unit to the light source unit fixing member.

18. The backlight assembly of claim 15, further comprising auxiliary light source unit fixing members which are coupled to the light source unit fixing member so as to fix the light source unit to the light source unit fixing member, wherein the auxiliary light source unit fixing members surround top surfaces and side surfaces of the dummy regions.

19. The backlight assembly of claim 18, wherein the auxiliary light source unit fixing members are coupled to the light source unit fixing member by screws.

20. The backlight assembly of claim 15, wherein the light source unit fixing member comprises coupling holes which are formed in the surface of the light source unit fixing member to correspond to the dummy regions, wherein the dummy regions are inserted into the coupling holes so as to fix the light source unit to the light source unit fixing member.

21. The backlight assembly of claim 20, wherein each of the coupling holes comprises a protruding portion formed at an entrance thereof, and each of the dummy regions comprises a protrusion formed on an end thereof.

22. The backlight assembly of claim 11, wherein the light source unit is placed on a sidewall of the chip housing.

23. The backlight assembly of claim 11, wherein the light source unit fixing member is formed by extrusion of aluminum having thermal conductivity.

24. The backlight assembly of claim 23, wherein the first LED package and the second LED package are mounted directly on the light source unit fixing member.

* * * * *